United States Patent [19]

Yamagishi et al.

[11] Patent Number: 5,387,809
[45] Date of Patent: Feb. 7, 1995

[54] SEMICONDUCTOR INTEGRATED CIRCUIT DEVICE CAPABLE OF OUTPUTTING A PLURALITY OF INTERFACE LEVELS

[75] Inventors: Mikio Yamagishi, Ohme; Kazuo Koide, Iruma; Tetsuo Nakano, Hamura, all of Japan

[73] Assignee: Hitachi, Ltd., Tokyo, Japan

[21] Appl. No.: 820,005

[22] Filed: Jan. 13, 1992

[30] Foreign Application Priority Data

Feb. 25, 1991 [JP] Japan ................................ 3-053345

[51] Int. Cl.$^6$ ............................................. H01L 27/02
[52] U.S. Cl. ...................................... 257/203; 257/204; 257/207; 257/208
[58] Field of Search ............... 257/500, 203, 204, 205, 257/207, 208; 307/440, 465.1

[56] References Cited

FOREIGN PATENT DOCUMENTS

| | | |
|---|---|---|
| 53-60188 | 5/1978 | Japan . |
| 57-199250 | 12/1982 | Japan . |
| 61-264747 | 11/1986 | Japan . |
| 64-31438 | 2/1989 | Japan . |
| 57-176585 | 10/1989 | Japan . |
| 239455 | 2/1990 | Japan . |
| 247843 | 2/1990 | Japan . |

*Primary Examiner*—Sara W. Crane
*Attorney, Agent, or Firm*—Fay, Sharpe, Beall, Fagan, Minnich & McKee

[57] ABSTRACT

A semiconductor integrated circuit device includes an interface corresponding to a relatively high signal level; an interface corresponding to a relatively low signal level; and an internal circuit made responsive to a signal through either interface for generating a signal to be transmitted to the other interface. The interface corresponding to a relatively high level, the internal circuit, and a drive control circuit constituting the input circuit and output circuit of the interface corresponding to a relatively low level are operated by an operating voltage corresponding to the relatively high level. An output element of the output circuit in the interface corresponding to a relatively low level, which is to be driven by the drive control circuit, is operated by an operating voltage corresponding to the relatively low level.

10 Claims, 5 Drawing Sheets

SEMICONDUCTOR INTEGRATED CIRCUIT DEVICE CAPABLE OF OUTPUTTING A PLURALITY OF INTERFACE LEVELS

BACKGROUND OF THE INVENTION

The present invention relates to a semiconductor integrated circuit device and, more particularly, to a technology which is effected when used in a CMOS (i.e., Complementary MOS) integrated circuit having input/output interfaces of different levels, for example.

An example of a semiconductor integrated circuit device having a function to handle a plurality of signal levels is disclosed in Japanese Patent Laid-Open No. 176585/1982. According to this Laid-Open Application, a circuit constituting an electronic watch or an electronic desk computer has its operating voltage dropped to reduce the current consumption. In this case, the display signal level of a liquid crystal or the like is so much higher than the aforementioned operating voltage that level changing circuits become necessary. In order to reduce the number of these level changing circuits, the operating voltage of a RAM for storing the display data is raised according to the display signal level, and the data to be written in the RAM are written at a changed level whereas the data to be read out from the RAM have their data level dropped by a clocked inverter circuit before they are outputted.

An example of a semiconductor device, which has succeeded in reducing the influences of supply noises due to the spike current at the switching time of an output circuit by forming the output circuit supply terminals of different in-chip pads, is disclosed in Japanese Patent Laid-Open No. 264747/1986.

In Japanese Patent Laid-Open No. 199250/1982, there is disclosed another example of a semiconductor integrated circuit device which is enabled to supply power selectively to a plurality of in-chip functional blocks by dividing the power supply line to the functional blocks, thereby to reduce a rise in the design and production costs accompanying the production of the multiple kinds in a small quantity for achieving multiple functions by a single design.

In Japanese Patent Laid-Open No. 31438/1989, there is disclosed an example of a gate array device which is enabled to reduce the power supply noises or to use another supply line by providing a wiring line for a basic cell and an I/O cell to lead in the supply power.

In Japanese Patent Laid-Open No. 47843/1990, there is disclosed an example of an integrated circuit manufacturing method, by which a band-shaped metal film is formed and cut by setting positions to be electrically connected with an input/output buffer circuit portion in a manner to correspond to the leads of a package so that the cut pieces may be used as bonding pads.

In Japanese Patent Laid-Open No. 39455/1990, there is disclosed an example of a large-scale integrated circuit such as a gate array or Sea-of gate array, in which a plurality of electrode pads are formed to cause the portions cut at predetermined positions to act as individually independent supply patterns so that the power may be fed to the necessary circuits only.

In Japanese Patent Laid-Open No. 60188/1978, there is disclosed an example of an integrated circuit having composite functions to make it possible to control the power supply for each function thereby to reduce the power consumption by providing power supply lines separately for the individual functions inside of an integrated circuit.

SUMMARY OF THE INVENTION

Developments are progressing in CMOS integrated circuits which are operated by a voltage equal to or lower than about 3 V so as to reduce the power consumption and to speed up the operation. However, most existing information processing devices or memory circuits such as microprocessors are operated by a relatively high voltage such as about 5 V.

In the development of the aforementioned semiconductor integrated circuit device to be operated by the low voltage of about 3 V, therefore, it is also conceivable to supply the supply voltage of about 5 V from the outside so as to maintain the compatibility with the system of about 5 V, and it is further conceivable to drop the supply voltage internally to establish the aforementioned low voltage and to add a level changing function to an input/output interface unit. When, in this case, the device is incorporated into a system to be operated by a low voltage of 3 V or the like, it can be operated by invalidating the operation of a voltage drop circuit and by establishing a passage for supplying the operating voltage directly to the internal circuit.

In this general purpose case, however, our investigations have revealed that the voltage drop circuit or the level changing circuit becomes so useless, when operated by the aforementioned low voltage, as to increase the power consumption accordingly. In case the semiconductor integrated circuit device developed is operated by only the low supply voltage such as 3 V, there arises a problem that the low operating voltage restricts the application to deteriorate the general-purpose usage.

The above-specified prior art has not been premised by the aforementioned technical problems and lacked in considerations from the standpoint of constructing one system by combining the semiconductor integrated circuit devices having different signal levels, so that it has failed to disclose any effective solution for the problems. What has been disclosed by the Japanese Patent Laid-Open No. 176585/1982 relating to the semiconductor integrated circuit device having the function to handle the plurality of signal levels is limited to the single semiconductor integrated circuit device such as the electronic watch or the electronic desk computer.

Thus, we have conceived a semiconductor integrated circuit device which is enabled to construct one information processing system by using semiconductor integrated circuit devices having different signal levels.

An object of the present invention is to provide a semiconductor integrated circuit device having a novel function to construct one system with a simple structure by using semiconductor integrated circuit devices having different signal levels.

The aforementioned and other objects and novel features of the present invention will become apparent from the following description to be made with reference to the accompanying drawings.

The summary of the invention to be disclosed hereinafter will be briefly described in the following. Specifically, there is provided a semiconductor integrated circuit device comprising: an interface corresponding to a relatively high signal level; an interface corresponding to a relatively low signal level; and an internal circuit made responsive to a signal through either of said interfaces for generating a signal to be transmitted to the other interface. The interface corresponding to a relatively high level, the internal circuit, and a drive control circuit constituting the input circuit and output circuit of the interface corresponding to a relatively low level are operated by an operating voltage corresponding to the relatively high level. An output element of the output circuit in the interface corresponding to a relatively low level, which is to be driven by said drive control circuit, is operated by an operating voltage corresponding to said relatively low level.

According to the above-specified means, a semiconductor integrated circuit device having a level changing function with a simple structure can be achieved to construct one information processing system with semiconductor integrated circuit devices having different signal levels by interposing that semiconductor integrated circuit device.

DESCRIPTION OF THE PREFERRED EMBODIMENTS

Figure 1:
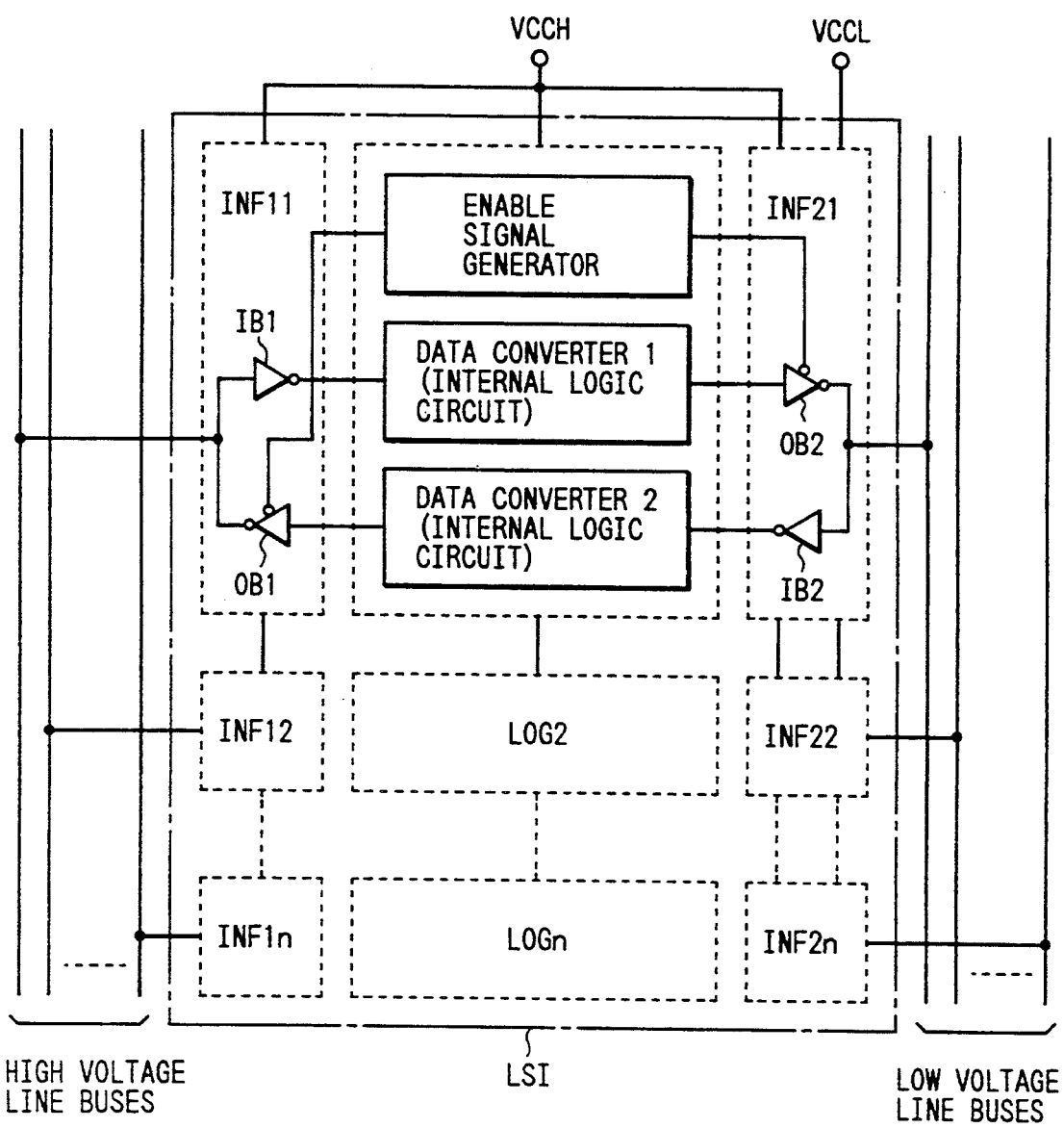
FIG. 1 is a block diagram showing one embodiment of a semiconductor integrated circuit device according to the present invention.

FIG. 1 is a block diagram showing one embodiment of a semiconductor integrated circuit device according to the present invention. The individual circuit blocks of the same Figure are formed over a single semiconductor substrate of single crystal silicon or the like by the manufacture technology of the well-known CMOS integrated circuit.

The semiconductor integrated circuit device LSI is indicated by single-dotted lines. The semiconductor integrated circuit device of this embodiment includes an interface INF1 connected with high voltage line buses of about 5 V and an interface INF2 connected with low voltage line buses of about 3 V. The semiconductor integrated circuit device LSI of this embodiment has a data conversion circuit for transferring data between the aforementioned two buses, although not especially limited thereto.

An interface INF11 corresponding to one of the high voltage line buses is composed of an input buffer IB1 and an output buffer OB1. The output buffer OB1 has a tri-state output function and is brought into an output high impedance state when the semiconductor integrated circuit device LSI itself is in an inoperative state and when it receives the data from the high voltage line buses even if the semiconductor integrated circuit device LSI is in an operative state. The output buffer OB1 is controlled by a control signal, which is generated by an enable signal generator, to generate a high voltage line output signal corresponding to input data when it outputs the output signal to the high voltage line bus through the output buffer OB1. The aforementioned input buffer IB1 has its output signal fed to the input of a data converter 1. On the other hand, the aforementioned output buffer OB1 has its input fed with data generated by a data converter 2.

An interface INF21 corresponding to one of the low voltage line buses is composed of an input buffer IB2 and an output buffer OB2. The output buffer OB2 also has a similar tri-state output function and is brought into an output high impedance state when the semiconductor integrated circuit device LSI itself is in the inoperative state and when it receives the data from the low voltage line buses even if the semiconductor integrated circuit device LSI is in the operative state. The output buffer OB2 is controlled by a control signal, which is generated by the aforementioned enable signal generator, to generate a low voltage line output signal corresponding to input data when it outputs the output signal to the high voltage line bus through the output buffer OB1. The aforementioned input buffer IB2 has its output signal fed to the input of the data converter 2. On the other hand, the aforementioned output buffer OB2 has its input fed with data generated by the data converter 1.

As a result, in case the data are to be transmitted from the high voltage line bus to the low voltage line bus, the input buffer IB1 of the high voltage interface INF11 is brought into the operative state to transmit its input signal to the data converter 1. This data converter 1 has its output signal outputted with a changed level through the output buffer OB2 of the low voltage interface INF21 or the like to the low voltage line bus. The aforementioned data converter 1 not only transmits the input data as is without being processed, but also performs a data conversion by processing the input data logically in case the semiconductor integrated circuit device LSI has a specific information processing function.

On the contrary, in case the data are to be transmitted from the low voltage line bus to the high voltage line bus, the input buffer IB2 of the low voltage interface INF21 is brought into the operative state to transmit its input signal to the data converter 2. This data converter 2 has its output signal outputted with a changed level through the output buffer OB1 of the high voltage interface INF11 or the like to the high voltage line bus. As above, the aforementioned data converter 2 not only transmits the input data as is without being processed, but also performs a data conversion by processing the input data logically in case the semiconductor integrated circuit device LSI has a specific information processing function.

The aforementioned selective controls of the input buffers and output buffers are so effected by the not-shown control signals that the enable signal generator generates the enable signals in the aforementioned combination in accordance with the data transfer directions.

In case a plurality (i.e., n in the same Figure) of high voltage line buses are provided, they correspond to the aforementioned interfaces INF11 to INF1n. These interfaces correspond to logic circuits LOG2 to LOGn similar to the aforementioned ones. Here, the enable signal generator is commonly used among the individual interfaces INF11 to INF1n. In case a plurality (i.e., n in the same Figure) of low voltage line buses are provided, they respectively correspond to the aforementioned interfaces INF21 to INF2n. These interfaces correspond to logic circuits LOG2 to LOGn similar to the aforementioned ones. Here, the enable signal generator is commonly used among the individual interfaces INF21 to INF2n. In the aforementioned internal logic circuit, the aforementioned plurality of input data are inputted, when they are logically processed to their mutual logic circuits so that their predetermined conversions are accomplished.

In case of a bus coupling device in a later-described multi-microprocessor system, for example, the data array is converted if two microprocessors are of 68000 and 80 types. More specifically, the microprocessor of 80 type has a byte array of Little-endian, in which the less significant bytes of data are arrayed at the less significant addresses, whereas the microprocessor of 68000 type has a byte array of Bigendian in which the more significant bytes of data are arrayed at the less significant addresses. In case of bi-directional data transfers, therefore, the data replacement is necessarily performed by the aforementioned data converters.

The semiconductor integrated circuit device LSI of this embodiment has high and low voltage signal lines, through which an output control circuit excepting later-described MOSFETs and the input buffer IB2 are operated for not only the high voltage interface INF1 and the internal logic circuit such as the data converter 1, the data converter 2 or the enable signal generator but also the low voltage interface INF2 by a supply voltage VCCH corresponding to the high voltage line. And, a supply voltage VCCL is used as the operating voltage for only MOSFETs of the aforementioned output buffer OB2 for generating the output signal.

Figure 2:
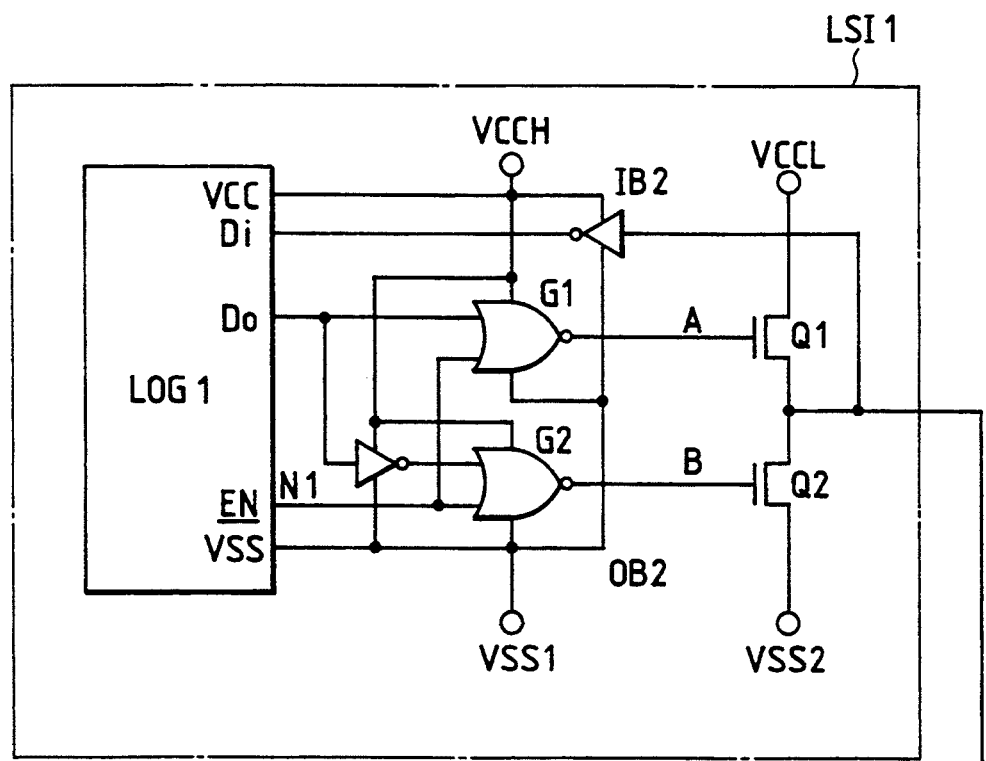
FIG. 2 is a circuit diagram showing one embodiment of both an interface at a low signal level side of the semiconductor integrated circuit device and an interface of a low signal level semiconductor integrated circuit device to be connected therewith.
Figure 2:
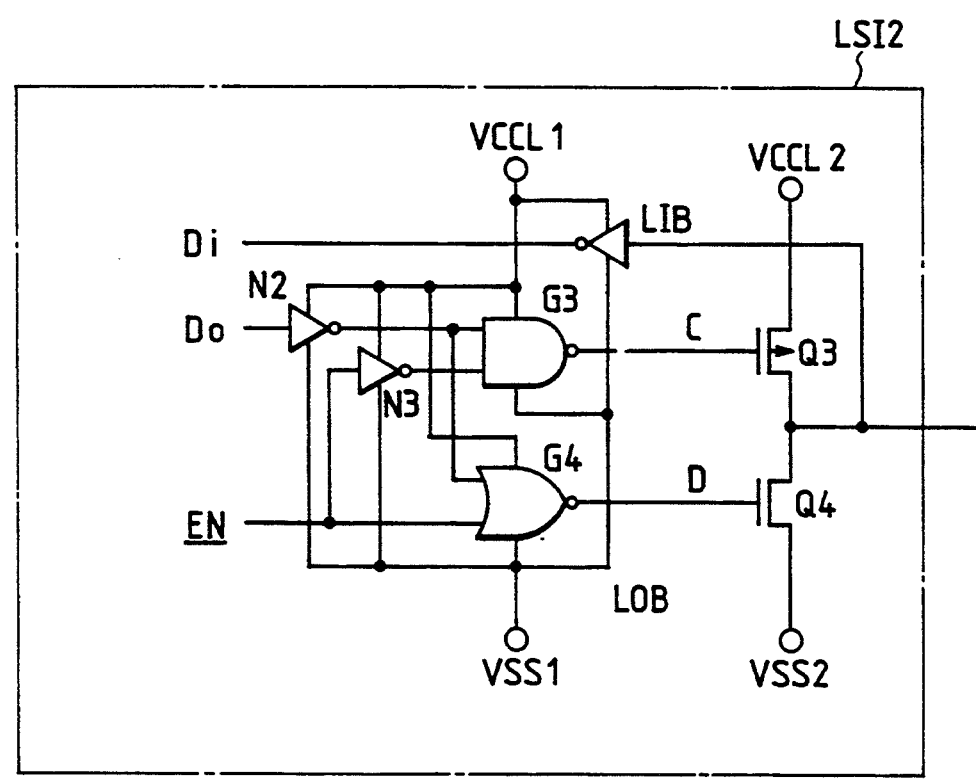

FIG. 2 is a circuit diagram showing one embodiment of the aforementioned low voltage interface INF2.

An internal circuit LOG1 includes the enable signal generator, the data converter 1 and the data converter 2, which correspond to the aforementioned low voltage interface INF2. The internal circuit LOG1 has an operation voltage terminal VCC, an input terminal Di for the data converter 2, an output terminal Do for the data converter 2, an enable signal EN for the output buffer OB2, and an earth potential terminal VSS.

The output buffer OB2 is constructed to include a drive control circuit composed of NOR gate circuits G1 and G2, and an inverter circuit N1; and an output circuit composed of output MOSFETs Q1 and Q2. The operating voltages of the aforementioned drive control circuit and input buffer IB2 to be used are high voltages VCCH and VSS1 like the internal logic circuit LOG1 although those circuits constitute the low voltage interface INF2.

On the other hand, an output circuit is constructed by connecting the N-channel type MOSFETs Q1 and Q2 in a push-pull arrangement. The MOSFET Q1 has its drain fed with the low supply voltage VCCL. An independent earth potential terminal VSS2 is assigned to the source of the MOSFET Q2, although not especially limited thereto.

A drive signal A to be fed to the gate of the output MOSFET Q1 at the supply voltage VCCL is generated by the NOR gate circuit G1. A drive signal B to be fed to the gate of the output MOSFET Q2 at the earth potential VSS2 of the circuit is generated by the NOR gate circuit G2. The aforementioned NOR gate circuits G1 and G2 are commonly fed with the enable signal EN, and the NOR gate circuit G1 has its output fed with the output terminal Do of the data converter 1 whereas the NOR gate circuit G2 has its input fed with the signal which is inverted by the inverter circuit N1.

When the enable signal EN is at the high level, the output signals A and B of the NOR gate circuits G1 and G2 are fixed at the low level independently of the output signal Do of the data converter 1. As a result, both the MOSFETs Q1 and Q2 are turned off to bring the output into a high impedance state. At this time, a signal of small amplitude is generated by a low voltage line semiconductor integrated circuit device LSI2 to fetch the data.

When the enable signal EN is at the low level, the NOR gate circuits G1 and G2 operate substantially as inverter circuits to validate the output signal Do of the data converter 1. Specifically, when the output signal Do is at the high level, the drive signal A is set to the low level whereas the drive signal B is set to the high level. As a result, the output MOSFET Q2 is turned on to generate an output signal of the low level. Since, at this time, the gate of the output MOSFET Q2 is fed with a high voltage corresponding to the VCCH, the voltage transferred thereto is so high that a high current drivability can be achieved with the relatively small element size.

When the output signal Do is at the low level, the drive signal A is set to the high level whereas the drive signal B is set to the low level. As a result, the output MOSFET Q1 is turned on to generate an output signal of the high level. At this time, the output MOSFET Q1 has its gate fed with a high level corresponding to the high level such as VCCH. Thus, notwithstanding that the output MOSFET Q1 performs the source-follower operation, its gate is fed with such a high voltage VCCH as exceeds the threshold voltage with respect to the low supply voltage VCCL that it can output the low supply voltage VCCL without any level loss.

On the other hand, the earth potential to be fed to the source of the output MOSFET Q2 is fed through a wiring line of a terminal or pad that is independent of the aforementioned drive control circuit and internal circuit. As a result, the input buffer IB2 and the internal circuit can be freed from being adversely affected by the noise generated in the earth potential when the output MOSFET Q2 is ON.

Incidentally, the low voltage line semiconductor integrated circuit device LSI2 has its internal circuit operated by the operating voltage at the low voltage VCCL. Therefore, the output circuit used is exemplified by a CMOS circuit composed of a P-channel type MOSFET Q3 and an N-channel type MOSFET Q4. Drive signals C and D to be fed to the gates of the output MOSFETs Q3 and Q4 of the CMOS structure are generated by a NAND gate circuit G3 and a NOR gate circuit G4. Specifically, the circuit corresponding to the P-channel type MOSFET Q3 is required to invert the level so that it is exemplified by the NAND gate circuit G3. The enable signal EN for controlling those gate circuits G3 and G4 is fed to the input of the NAND gate circuit G3, which is inverted by an inverter circuit N3. Moreover, the signal Do to be outputted is inverted by an inverter circuit N2 and is fed commonly to the other inputs of the aforementioned NAND circuit G3 and NOR gate circuit G4.

In this embodiment, in order that the internal circuit and an input buffer LIB may be kept away from the influences of the noise generated at the time of the operation of the output circuit, the earth potential VSS2 of the output MOSFET Q4 is made separate from the earth potential VSS1 of the internal circuit, although not especially limited thereto. Likewise, the low voltage VCCL to be fed to the source of the output MOSFET Q3 is exemplified by voltages VCCL1 and VCCL2 which are separate from the internal circuit and the aforementioned output MOSFET Q3.

Figure 3:
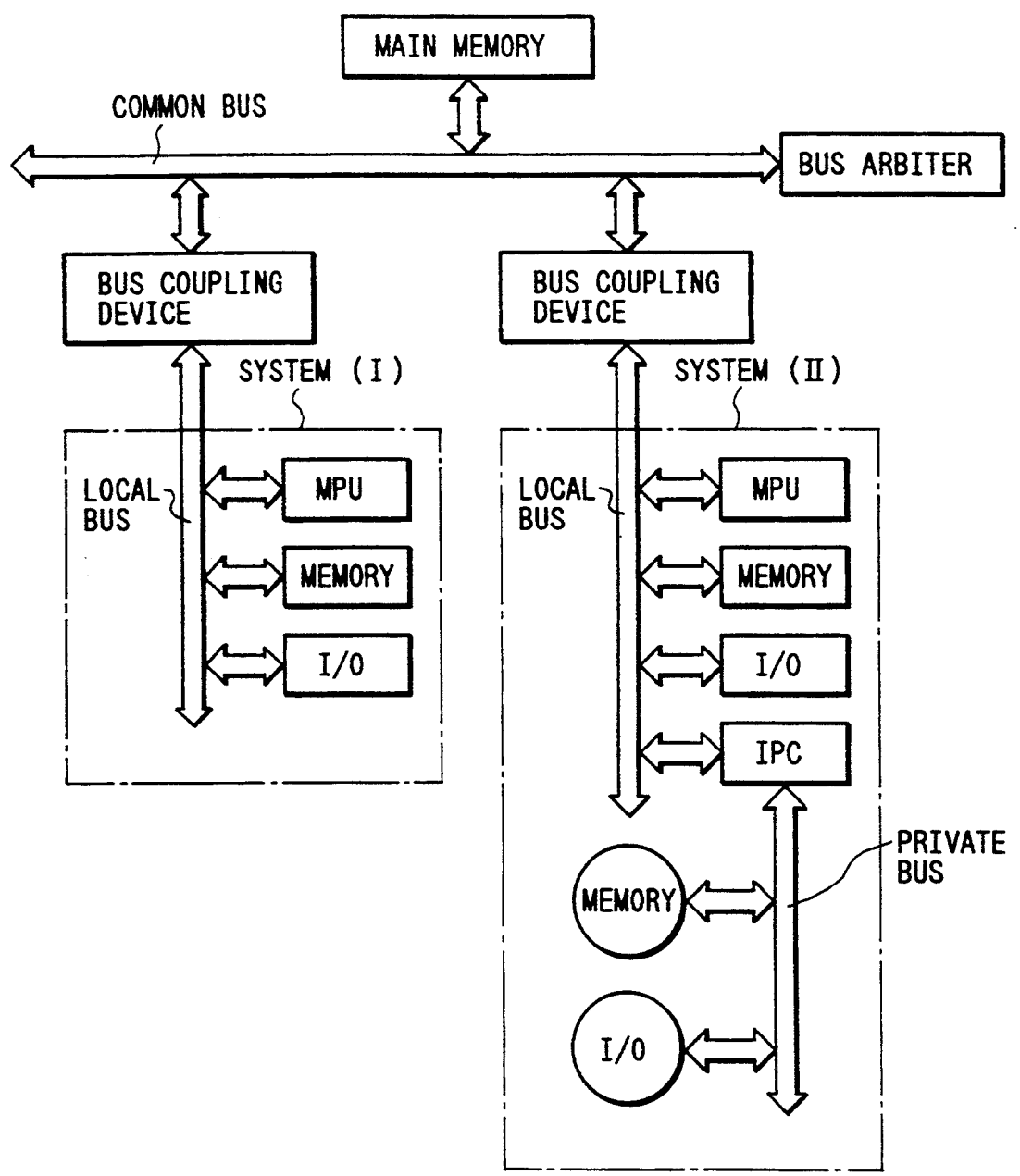
FIG. 3 is a block diagram showing one embodiment of a multi-microcomputer system using the semiconductor integrated circuit device according to the present invention.

FIG. 3 is a block diagram showing one embodiment of the multi-microcomputer system in which the semiconductor integrated circuit device according to the present invention is used.

This embodiment is constructed such that a system (I) and a system (II) use a main memory on a common bus. This common (global) bus is equipped with a bus arbiter.

The system (I) is equipped with a microprocessor MPU, a memory and an input/output unit I/O on a local bus. The system (II) is equipped with a microprocessor MPU, a memory, and input/output units I/O and IPC on a local bus and is equipped with a private bus through the IPC for extending a memory and an I/O.

In the multi-microcomputer system thus constructed, the semiconductor integrated circuit device according to the present invention is used as a bus coupling device.

For example, in case the systems (I) and (II) are constructed of a semiconductor integrated circuit device of 5 V whereas the main memory and the bus arbiter are constructed of a semiconductor integrated circuit device of 3 V, the bus coupling device to be packaged in each of the systems (I) and (II) is given a level changing function. Moreover, if the system (I) is exemplified by a microprocessor MPU of 80 type whereas the system (II) is exemplified by a microprocessor MPU 68000, one bus coupling device is additionally given a function of converting the data array. When, in the main memory, the data array is unified into the Big-endian, the bus coupling device corresponding to the system (I) is additionally given a data converting function.

In another mode, the system (I) may be constructed of a semiconductor integrated circuit device of low voltage type whereas the system (II) may be constructed of a semiconductor integrated circuit device of high voltage type. If, moreover, the main memory belongs to the high voltage line, the present invention is applied to the bus coupling device to be packaged in the system (I). If, in the aforementioned structure, the main memory belongs to the low voltage line, the present invention is applied to the bus coupling device to be packaged in the system (II).

On the contrary, if the system (I) is constructed of a semiconductor integrated circuit device of the high voltage type whereas the system (II) is constructed of a semiconductor integrated circuit device of the low voltage line and if the main memory belongs to the high voltage line, the present invention is applied to the bus coupling device to be packaged in the system (II). If the main memory unit belongs to the low voltage line, the present invention is applied to the bus coupling device to be packaged in the system (I).

The bus coupling device thus far described may have a direct memory access control circuit packaged therein. By this direct memory access control circuit, for example, the bus coupling device of the system (I) may be caused to read the data from the memory on the local bus and store them in the main memory or, on the contrary, to read the data from the main memory and store them in the local bus. If, moreover, a buffer memory is packaged in the direct memory access control circuit so that the data from the memory on the local bus are transferred to the buffer memory, the data of the buffer memory may be transferred to the main memory by opening the local bus to acquire the common bus. Since, in this case, the local bus is open when the data of the buffer memory are transferred to the main memory, the information processing can be accomplished by using the local bus of the microprocessor MPU to improve the throughput of the system.

By using the semiconductor integrated circuit device as in this embodiment, the individual semiconductor integrated circuit devices composing the microcomputer system can have their circuits designed without considering the operations at a plurality of supply voltages. And, one system can be constructed by interposing the semiconductor integrated circuit device having the level changing function and the data converting function according to the present invention between the semiconductor integrated circuit devices using the different kinds of supply voltages. Thus, one data processing system can be easily constructed by combining the existing high voltage line semiconductor integrated circuit device with a low voltage line semiconductor integrated circuit device which is intended to increase the speed and reduce the power consumption.

Figure 4:
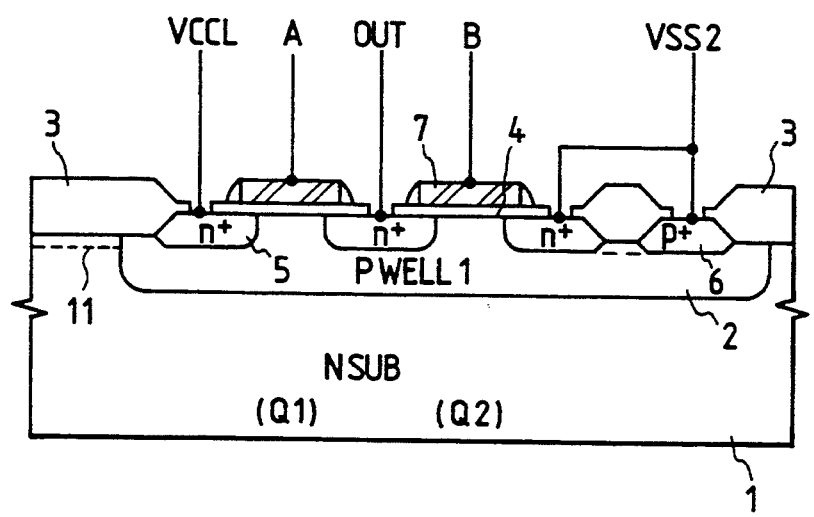
FIG. 4 is a section showing the structure of elements according to one embodiment of an output MOSFET in the interface at the low signal level side.

FIG. 4 is a section showing an element structure of one embodiment of the output MOSFETs Q1 and Q2 shown in FIG. 2.

Over an N-type semiconductor substrate (as will be abbreviated to "NSUB"), there is formed a P-type well region 2 (i.e., PWELL1), which in turn is formed with the N-channel type MOSFETs Q1 and Q2. These two MOSFETs Q1 and Q2 are formed with $n^+$-type sources and drains. A gate electrode 7 is formed over a thin gate insulating film 4 extending between those sources and drains. Incidentally, reference numeral 3 designates an element separating field insulating film, which is underlain by a P-type channel stopper 11.

The MOSFET Q1 has its drain 5 fed with the low voltage VCCL and its gate fed with the drive signal A. The MOSFET Q2 has its gate fed with the drive voltage B, and its source and an ohmic contact $p^+$-type region 6 formed in the aforementioned PWELL1 are fed with the earth potential VSS2 from an independent wiring line or terminal. On the other hand, the NSUB is fed with the high voltage VCCH as a bias voltage, as will be described in the following. And, the shared source and drain region acting as the source of the MOSFET Q1 and the drain of the MOSFET Q2 is used as an output terminal OUT.

Figure 5:
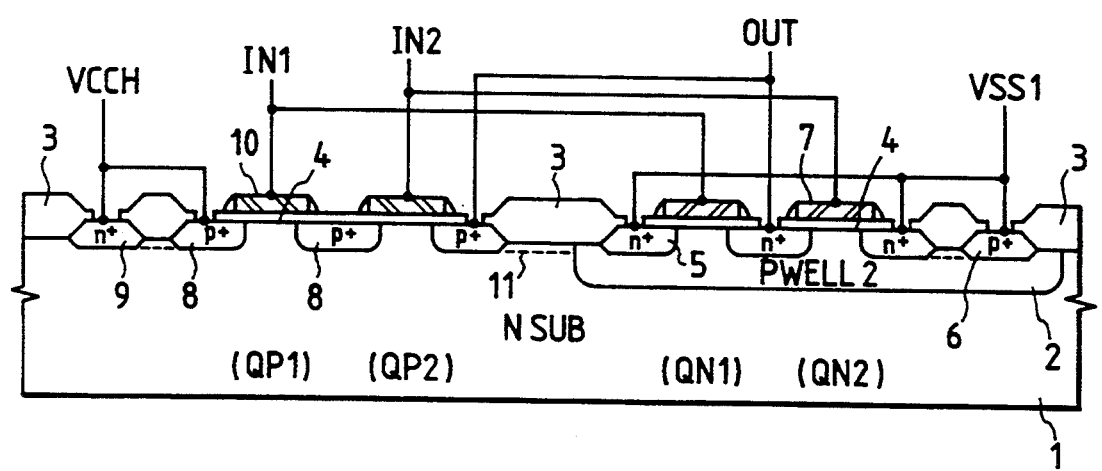
FIG. 5 is a section showing the structure of elements according to one embodiment of a CMOS circuit for constructing an internal circuit or a drive control circuit formed over a semiconductor substrate shared by the aforementioned output MOSFET.

FIG. 5 is a section showing an element structure of one embodiment of MOSFETs which are formed in the same substrate as the substrate 1 formed with the output MOSFETs Q1 and Q2 to constitute the internal circuit and the drive control circuit.

In the same Figure, two N-channel type MOSFETs (QN1 and QN2) constituting a two-input NOR gate circuit and two P-channel type MOSFETs (QP1 and QP2) are shown by way of example.

The N-channel type MOSFETs QN1 and QN2 are formed in a PWELL2 which is different from the well region PWELL1 for the aforementioned output MOSFETs. The ohmic contact region of the PWELL2 and the sources of the MOSFETs QN1 and QN2 are fed with the earth potential from the internal circuit earth potential line VSS1.

The P-channel type MOSFETs QP1 and QP2 are formed over the NSUB. This NSUB is fed with the high voltage VCCH as a bias voltage through an $n^+$-type ohmic contact region 9. The high voltage VCCH is also fed to the source 8 of the P-channel type MOSFET QP1. The aforementioned MOSFETs QP1 and QN1 have their gates shared and fed with an input signal IN1. The aforementioned MOSFETs QP2 and QN2 have their gates shared and fed with an input signal IN2. And, the drain of the MOSFET QP2 and the shared drain of the MOSFETs QN1 and QN2 are connected and used as the output terminal OUT.

In FIGS. 4 and 5, the MOSFETs Q1 and Q2 shown in FIG. 4 are formed into one independent well region PWELL1 so that they can be completely electrically separated from the elements constituting the remaining internal circuit and drive control circuit shown in FIG. 5. Thus, the internal circuit and drive control circuit to be operated at the high voltage VCCH and the output circuit to be operated at the low voltage VCCL can be provided to coexist over the common semiconductor substrate by the simple structure. Moreover, the earth potential to be fed to the source of the output MOSFET Q2 is fed from the independent earth line VSS2 so that the noise generated therein and transmitted to the earth line VSS1 of the internal circuit or the like can be minimized.

Figure 6:
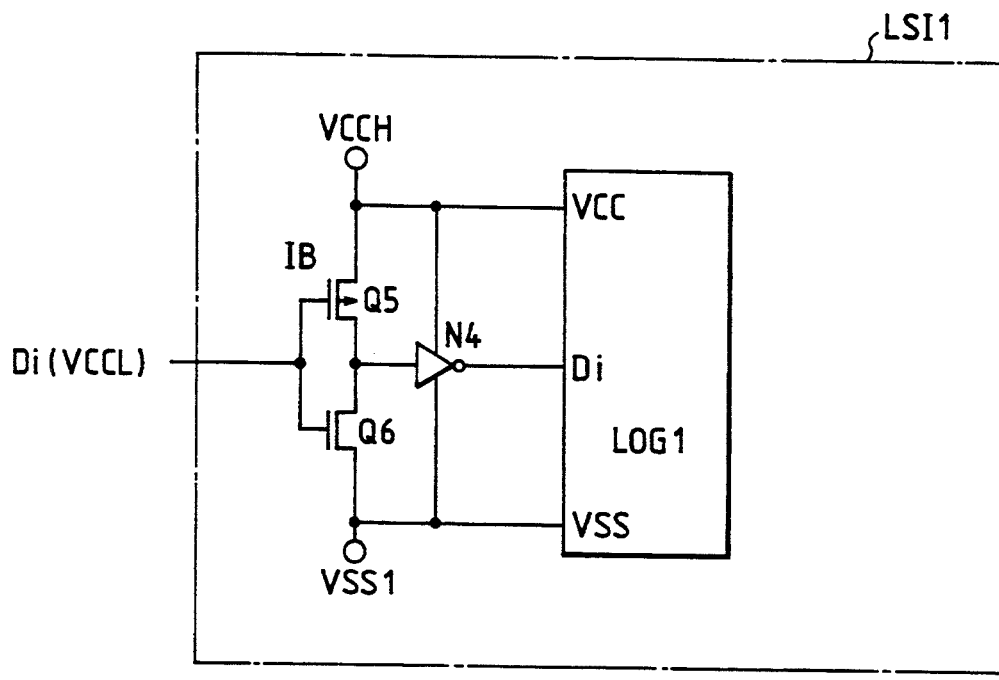
FIG. 6 is a circuit diagram showing one embodiment of an input circuit in the interface at the low signal level side.

FIG. 6 is a circuit diagram showing one embodiment of the input buffer for receiving a low voltage line signal. The input buffer has its initial stage circuit IB constructed of a CMOS inverter which is composed of a P-channel type MOSFET Q5 and an N-channel type MOSFET Q6. The initial stage circuit has the high voltage VCCH as its operating voltage although its input is fed with a signal of the low voltage VCCL line. However, the initial stage circuit has its logic threshold voltage VL set not to a voltage corresponding to the intermediate potential VCCH/2 of the high voltage VCCH but to a voltage such as VCCL/2 corresponding substantially to the intermediate voltage of the signal of the low voltage VCCL line by setting the conductance at the N-channel type MOSFET Q6 to a higher level than that of the P-channel type MOSFET Q5. The level margin corresponding to the low voltage line signal can be retained by thus biasing the logic threshold voltage of the CMOS inverter circuit composed of Q5 and Q6 to a low level. The output signal of the aforementioned initial stage circuit IB is inputted to an input terminal Di of the internal circuit LOG1 through an inverter circuit N4 acting as an amplifier.

Figure 7:
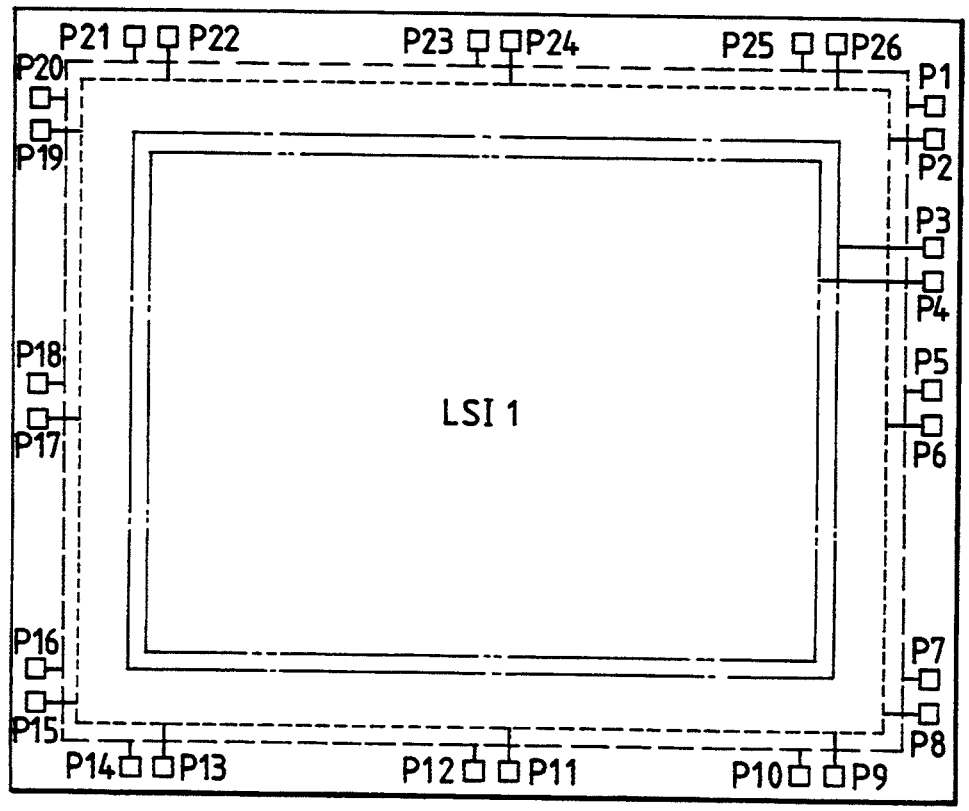
FIG. 7 is a layout pattern diagram showing one embodiment of a method of forming supply wiring lines in the semiconductor integrated circuit device according to the present invention.

FIG. 7 is a layout pattern diagram of one embodiment of the supply wiring line which is arranged in the semiconductor integrated circuit device according to the present invention.

Along the outer periphery of the semiconductor chip, there are paired a supply line, as indicated by broken lines, and an earth line, as indicated by dotted lines. These two looped wiring lines are arranged with bonding pads P1, P2, P4, P6 to P25 and P26.

In the semiconductor integrated circuit device of this embodiment, the aforementioned looped wiring lines are suitably cut in accordance with the structure of the input/output interfaces so that they are fed with the voltages corresponding to the bonding pads connected therewith and the earth potential. As to the earth potential, the pads corresponding to the aforementioned output circuit may be cut and separated so that the earth potential may be fed by the independent pads and the wiring lines. Thanks to this structure, the semiconductor integrated circuit device can be constructed not only into the aforementioned interface having two kinds of signal levels but into an interface having three or more kinds of signal levels. Specifically, the semiconductor integrated circuit device may be caused to handle several kinds of levels by having an interface of 5 V, an interface of 3.3 V, an interface of 2 V and an interface of 1.5 V.

In this case, the internal circuit is fed with the operating voltage through the supply line and earth line which are arranged to form loops internally, as indicated by single-dotted and double-dotted lines, respectively. This internal circuit has its operating voltage exemplified by the highest supply voltage of 5 V so that it may transfer data with any of the interfaces. For this, the high voltage VCCH is fed from a pad P3.

The input buffer operating voltage responsive to the aforementioned low voltage line input signal is exemplified by the high voltage VCCH as in the internal circuit. This is because the signal of the interface of 1.5 V, for example, is once outputted through the internal circuit even if it is outputted through the interface of 2 V. Even in case the semiconductor integrated circuit device has interfaces of three or more levels, as above, its low voltage line has only its output circuits fed with the respectively corresponding operating voltages.

Thanks to this structure, the semiconductor integrated circuit device having the level changing function can be standardized. This is because the drive control circuit of the input buffer, the internal circuit and the output buffer can be unified to have the highest operating voltage independently of the individual signal levels so that only the output MOSFETs of the remaining low voltage line can be operated by the respectively corresponding supply voltages. And, that drive control circuit is operated by the aforementioned high voltage VCCH so that it can have a high signal level. As a result, the output circuit to be used can be exemplified by the push-pull circuit which is composed of N-channel type MOSFETs. If these N-channel type MOSFETs are used, a high drive current can be obtained with a small occupied area. Since, moreover, the drive signal is set to the aforementioned high level, a higher output current can be established without any level loss of the output signal.

The following operational effects can be obtained from the embodiments thus far described:

(1) The semiconductor integrated circuit device comprises: an interface corresponding to a relatively high signal level; an interface corresponding to a relatively low signal level; and an internal circuit made responsive to a signal through either of said interfaces for generating a signal to be transmitted to the other interface, The interface corresponding to the relatively high level, the internal circuit, and a drive control circuit constituting the input circuit and output circuit of the interface corresponding to the relatively low level are operated by the operating voltage corresponding to the relatively high level. The output element of the output circuit in the interface corresponding to the relatively low level, which is to be driven by said drive control circuit, is operated by the operating voltage corresponding to said relatively low level. According to this structure, it is sufficient to operate only the output element corresponding to the relatively low level with the operating voltage corresponding to the low level. Thus, a semiconductor integrated circuit device having a level changing function can be provided with a simple structure having because of no necessity for special level changing circuit.

(2) An N-type substrate is used to form an N-channel type MOSFET in a P-type well region, and the aforementioned output element used is exemplified by an N-channel type push-pull output circuit formed in an independent well region. With this simple structure, an output circuit having two or more output levels can be formed.

(3) A high drive current can be achieved with a small occupied area by using the N-channel type MOSFET push-pull arrangement as the output circuit. In this case, by using an operating voltage corresponding to the relatively high level as that of the drive control circuit, the output signal can be generated without any level loss while further reducing the element size.

(4) Thanks to the semiconductor integrated circuit device having the aforementioned input/output functions of a plurality of levels, one information processing system can be constructed by combining semiconductor integrated circuit devices constituting microprocessors, memories and various input/output devices of different signal levels.

(5) Thanks to the aforementioned effect (4), a semiconductor integrated circuit device such as a microprocessor or memory can dispense with an internal circuit to be operated by a plurality of operating voltages, to substantially enhance the general utility of the semiconductor integrated circuit device corresponding to a single voltage.

(6) A looped supply wiring line is formed in advance along the outer periphery of a chip and suitably cut to form one independent supply wiring line and is equipped with a plurality of bonding pads, and the cut independent supply wiring line is equipped with at least one bonding pad. Thus, the power supply in the semiconductor integrated circuit device handling a plurality of levels can be standardized.

Although our invention has been specifically described in connection with the embodiments thereof, it should not be limited to the embodiments but can naturally be modified in various manners without departing from the gist thereof. For example, the semiconductor integrated circuit device for transferring data in one direction at all times is correspondingly equipped with an input circuit and an output circuit. If, in this case, the data converting function is unnecessary, the output signal of the input circuit is transmitted as is to the input of the output circuit. In case the data are transferred as a block unit, on the other hand, the semiconductor integrated circuit device is equipped with a buffer memory as the internal circuit. The specific structure of the drive control circuit for the tri-state output control can take a variety of forms, including the aforementioned NOR gate circuit. And, the aforementioned tri-state output function can be omitted in the drive control circuit which has its output signal fed at all times to the input of one semiconductor integrated circuit device.

Another example may use a P-type substrate, N type well and P-channel type MOSFET for Q1 or Q3. In this case, simple CMOS circuits can be used. An N well will be applied instead of P WELL 1 and P WELL 2.

Although P WELL 1 and P WELL 2 are separated in the previous example, it is not always necessary to separate them.

The structure of the power supply of the semiconductor integrated circuit device should not be limited to having the aforementioned loop suitably cut, but can naturally have its layout designed in accordance with the interface packaged in the semiconductor integrated circuit device. In this case, each of the supply line corresponding to the highest voltage and the earth line for feeding the operating voltage to a number of circuits is constructed of one wiring line so that the operating voltage and the earth potential may be fed from the plurality of pads, or the plurality of pads may be connected by the wiring bonding with their common supply and earth leads. In case the LOC (i.e., Lead On Chip) technique is used, the leads corresponding to the earth and highest voltage may be connected with the plurality of bonding pads to drop the supply impedance.

The semiconductor integrated circuit device should not be limited to the CMOS circuit but may be formed of a structure using the CMOS circuit and bi-polar transistors, a structure composed of N-channel type MOSFETs or P-channel type MOSFETs, or a structure of bipolar transistors.

The present invention can be widely applied to a variety of semiconductor integrated circuit devices for handling a plurality of signal levels.

The effect to be obtained by the representative embodiments of the invention disclosed herein will be briefly described in the following. Specifically, the semiconductor integrated circuit device comprises: the interface corresponding to the relatively high signal level; the interface corresponding to the relatively low signal level; and the internal circuit made responsive to the signal through either of said interfaces for generating the signal to be transmitted to the other interface. The interface corresponding to the relatively high level, the internal circuit, and the drive control circuit constituting the input circuit and output circuit of the interface corresponding to the relatively low level are operated by the operating voltage corresponding to the relatively high level. The output element of the output circuit in the interface corresponding to the relatively low level, which is to be driven by said drive control circuit, is operated by the operating voltage corresponding to said relatively low level. According to this structure, it is sufficient to operate only the output element corresponding to the relatively low level with the operating voltage corresponding to the low level. The semiconductor integrated circuit device having a level changing function can be provided with a simple structure because of no necessity for any special level changing circuit.

What is claimed is:

1. A semiconductor integrated circuit device, comprising:

an internal logic circuit coupled to receive a first power supply voltage and which outputs a first output signal, one potential level of the first output signal representing said first power supply voltage; and an output circuit including a drive control circuit which is coupled to said internal logic circuit and to receive said first power supply voltage, and an output element which is coupled to said drive control circuit and to receive a second power supply voltage that is smaller than said first power supply voltage and which includes a push-pull type amplifier circuit comprising series-connected N-channel type MOSFETs, a second output signal being delivered from a common connected point of the series-connected N-channel type MOSFETs, one potential level of the second output signal representing said second power supply voltage, responsive to said first output signal.

2. A semiconductor integrated circuit device according to claim 1, wherein the potential level of said second output signal that represents said second power supply voltage is smaller than the potential level of said first output signal that represents said first power supply voltage.

3. A semiconductor integrated circuit device according to claim 5, wherein at least one of said drive control circuit and an internal circuit included in said internal logic circuit has a first conductivity-type MOSFET formed on a semiconductor substrate and a second conductivity-type MOSFET formed on a first well region on the semiconductor substrate, and wherein the series-connected N-channel type MOSFETs are second conductivity-type MOSFETs which are formed on a second well region on the semiconductor substrate, and wherein the second well region is electrically isolated from the first well region.

4. A semiconductor integrated circuit device according to claim 3, wherein each of said first conductivity-type MOSFETs is a P-channel type MOSFET and each of said second conductivity-type MOSFETs is an N-channel type MOSFET.

5. A semiconductor integrated circuit device according to claim 2, wherein at least one of said drive control circuit and an internal circuit included in said internal logic circuit has a first conductivity-type MOSFET formed on a semiconductor substrate and a second conductivity-type MOSFET formed on a first well region on the semiconductor substrate, and wherein the series-connected N-channel type MOSFETs are formed on a second well region on the semiconductor substrate, the second well region being electrically isolated from the first well region.

6. A semiconductor integrated circuit device according to claim 5, wherein said first conductivity-type MOSFET is a P-channel type MOSFET and each of said second conductivity-type MOSFETs is an N-channel type MOSFET.

7. A semiconductor integrated circuit device, comprising:

a first input circuit and a first output circuit;

a second input circuit and a second output circuit; and an internal logic circuit responsive to signals received from said first and second input circuits for sending corresponding data conversion signals to the second and first output circuits, respectively, said first and second output circuits each including a drive control circuit for receiving the corresponding data conversion signal and for outputting a drive signal corresponding to the received data conversion signal;

wherein said first input circuit and said first output circuit, said internal logic circuit, and the drive control circuit of said second output circuit are all operated by a first power supply voltage, and wherein said second output circuit further includes an output element that receives the drive signal from the drive control circuit of the second output circuit and outputs an output signal representing the level of the received drive signal, the output element being operated by a second power supply voltage that is lower than the first power supply voltage.

8. A semiconductor integrated circuit device according to claim 7, wherein said semiconductor integrated circuit device is composed of P-channel type MOSFETs formed over an N-type substrate and N-channel type MOSFETs formed in a P-type well region, and wherein the output element of the second output circuit for generating the output signal at a relatively low level is a push-pull circuit comprising N-channel type MOSFETs formed in an independent well region.

9. A semiconductor integrated circuit device according to claim 8, wherein the second output circuit receives the first power supply voltage and a reference voltage via independent internal wiring lines.

10. A semiconductor integrated circuit device according to claim 9, wherein the semiconductor integrated circuit device is formed on a semiconductor chip;

wherein said second output circuit has at least two independent power supply wiring lines formed by suitably cutting a closed power supply wiring line along the outer periphery of the chip, said second output circuit being supplied with said first power supply voltage via one of the independent power supply wiring lines;

wherein said closed power supply wiring line is equipped with a plurality of bonding pads;

wherein said one of the independent power supply wiring lines is equipped with at least one bonding pad receiving the first power supply voltage to be supplied to said second output circuit; and wherein another of the independent power supply wiring lines is equipped with at least one bonding pad receiving the second power supply voltage to be supplied to said second output circuit.

* * * * *